331-98
SEARCH ROOM

Sept. 17, 1957 E. WILLWACHER ET AL 2,806,951
COUPLING BETWEEN MICROWAVE AMPLIFIER AND WAVE GUIDE
Filed Dec. 3, 1952 3 Sheets-Sheet 1

Inventors:
ERWIN WILLWACHER
AND HERBERT WEBER
BY:

COUPLING BETWEEN MICROWAVE AMPLIFIER AND WAVE GUIDE

Filed Dec. 3, 1952 3 Sheets-Sheet 2

Inventors:
ERWIN WILLWACHER
AND HERBERT WEBER
BY: [signature]
Atty

COUPLING BETWEEN MICROWAVE AMPLIFIER AND WAVE GUIDE

Filed Dec. 3, 1952 3 Sheets-Sheet 3

Inventors:
ERWIN WILLWACHER
AND HERBERT WEBER
BY: [signature]

United States Patent Office 2,806,951

Patented Sept. 17, 1957

2,806,951

COUPLING BETWEEN MICROWAVE AMPLIFIER AND WAVE GUIDE

Erwin Willwacher, Ulm-Soflingen, and Herbert Weber, Ulm (Danube), Germany, assignors to Telefunken Gesellschaft fuer drahtlose Telegraphie G. m. b. H., Hannover, Germany Application December 3, 1952, Serial No. 323,742

Claims priority, application Germany December 4, 1951

15 Claims. (Cl. 250—36)

The present invention relates to microwave amplifiers, e. g. of the type comprising a three-element tube with substantially disc-like or cylindrical electrode terminals adapted to be coupled to a wave guide for the purpose of generating, amplifying and/or mixing high-frequency oscillations.

An object of the present invention is to provide means to enable operation of an amplifier of the above character at frequencies near its short-circuit frequency, i. e. the frequency at which such amplifier would oscillate upon short-circuiting of its electrode leads for high-frequency currents.

Another object of this invention is to provide means for so modifying a conventional wave guide as to enable a source of oscillations therein to transmit waves of a predetermined mode through said guide in one longitudinal direction but not in the other.

A further object of the invention is to provide means for so loading a rectangular wave guide as to enable excitation therein of dominant $TE_{10}$ (or $H_{10}$) waves having a length in excess of double the width *a*, or longer transverse dimension, of the wave guide.

Still another object of this invention, allied with the preceding one, is to provide means for efficiently coupling a source of $TE_{10}$ waves with a loading means for rectangular wave guides as set forth above.

According to the invention there is provided, in combination with a source of waves so inserted in a wave guide as to set up TE (transverse electric) waves therein, an elongated conductive member or bar extending in longitudinal direction of the guide and loading same capacitively, this bar being coupled to an electrode of the wave source by means of a connection offering a low impedance at least at high frequencies.

If the wave source is an amplifier having input and output circuits, the capacitively loaded wave guide may be included in either of said circuits. Usually, the amplifier will be a vacuum tube of the grid-controlled type, in which case the loading bar may be capacitively coupled or conductively connected to an annular conductive portion of the tube envelope representing a grid terminal; it is, however, equally feasible to provide a low-impedance connection between the loading bar and a plate lead or a cathode lead of the tube. It should be noted, moreover, that the invention is also applicable to velocity-modulated amplifiers or klystrons whose input or output gap may be coupled to the loaded wave guide in analogous manner.

The above and other objects and features of the present invention will become more fully apparent from the accompanying drawing which serves to explain the principles underlying the invention and to show several representative embodiments thereof. In the drawing:

Figs. 1*a* and 1*b* show a three-element vacuum tube with annular grid and plate terminals coupled to a rectangular wave guide, Fig. 1*b* being a section taken on the line 1*b*—1*b* of Fig. 1*a*;

Figs. 2*a* and 2*b* show an arrangement similar to that of Figs. 1*a* and 1*b* but supplemented by a further wave guide, Fig. 2*b* being a section taken on the line 2*b*—2*b* of Fig. 2*a*;

Fig. 3 is a view similar to Fig. 2*b* but showing a modified arrangement designed for shorter wavelengths;

Fig. 4*a* is a view similar to Fig. 2*a*, illustrating the improvement according to the present invention applied to the system of Fig. 3;

Figs. 4*b* and 4*c* are sections taken on lines 4*b*—4*b* and 4*c*—4*c*, respectively, of Fig. 4*a*;

Figs. 5*a* and 5*b* are views similar to Figs. 4*a* and 4*b*, respectively, showing a somewhat modified system according to the invention;

Figure 1A:
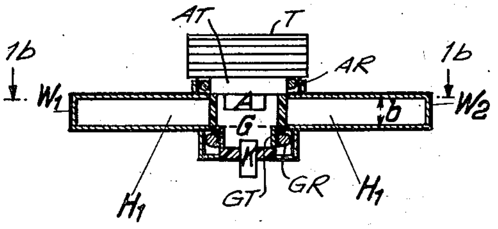
Figure 1B:
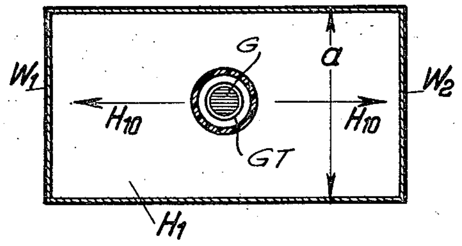

In Fig. 1 there is shown a triode T comprising an anode or plate A, a grid G and a cathode K, this triode being transversely inserted in a rectangular wave guide $H_1$ whose cross-section is defined by a longer side *a* and a shorter side *b*, the latter being parallel to the axis of the tube T. The anode A is provided with a cylindrical terminal AT coupled to the top of the guide $H_1$ by means of a conductive ring AR; similarly, the grid G has its annular terminal GT coupled to the bottom of the wave guide by means of a conductive, relatively flat ring GR. It will be understood that the coupling between the plate A and its terminal AT may be capacitive rather than conductive, in order to enable the proper operating potentials to be applied to the electrodes of tube T, in the well known manner, from suitable direct-current sources (not shown).

Figure 2A:
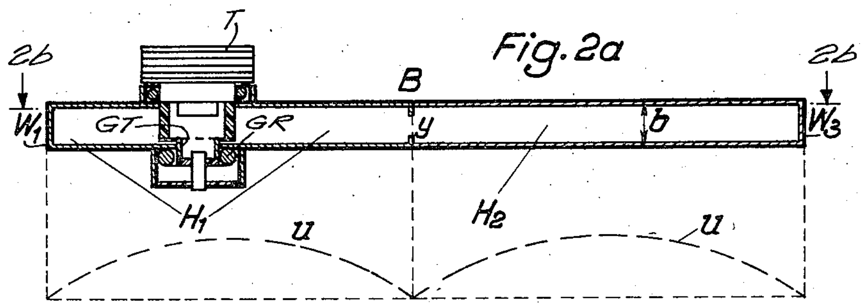

The wave guide $H_1$ is closed at its ends by walls $W_1$, $W_2$ causing it to act as a cavity resonator with a natural wavelength substantially equal to twice the spacing between these walls. So long as the operating free-space wave-length is less than the cutoff wavelength of the guide (i. e. less than double the width *a* thereof) but substantially greater than the short-circuit wavelength of the tube T, the capacitive loading of the guide by the tube electrode will be small and the $H_{10}$ mode (or $TE_{10}$ mode) will dominate within the guide; thus, waves having the electric vector in the *b* dimension of the guide will be propagated toward both walls $W_1$ and $W_2$. Under these circumstances it is a simple matter to couple a load circuit comprising a second wave guide $H_2$ to the guide $H_1$ in the manner shown in Figs. 2*a* and 2*b*; the load may be connected to such second wave guide either directly or by way of one or more additional wave guides. Thus in Figs. 2*a* and 2*b* the end wall $W_2$ has been replaced by a diaphragm B whose aperture *y* determines the coupling factor between the two guides; changing the width of this aperture will vary the coupling factor in any desired manner, inasmuch as the operating wavelength is less than the cutoff wavelength of the structure on either side of the diaphragm. In an extreme case the diaphragm $B_2$ may be omitted entirely, whereupon the wave $H_{10}$ from guide $H_1$ will continue substantially without attenuation within the guide $H_2$. At *u* there is illustrated in Fig. 2*a* the magnitude of the field in the electric plane, indicating the presence of a voltage node at the location of the diaphragm B. The natural frequency of the overall structure may be varied between wide limits by a displacement of the end wall $W_3$ of guide portion $H_2$, the position of this wall determining the location of the second voltage node as will be apparent from Fig. 2*a*.

Figure 3:
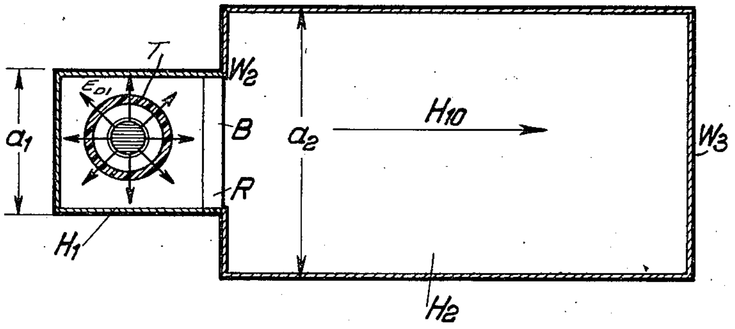

Fig. 3 illustrates the conditions obtaining when the operating frequency is increased to the order of the short-circuit frequency of the tube T. Under these circumstances there will occur appreciable loading of the wave guide $H_1$ by the inter-electrode capacitance of the tube, hence the dimensions of this guide must be sharply reduced to enable it to resonate at the desired frequency. Since the free-space operating wavelength will now exceed double the guide width $a_1$, the $H_{10}$ mode will be suppressed and the wave will be primarily of the $E_{01}$ (or $TM_{01}$) mode, spreading radially from the tube T with its electric vector lying in a plane transverse to the axis of the triode.

Figure 2B:
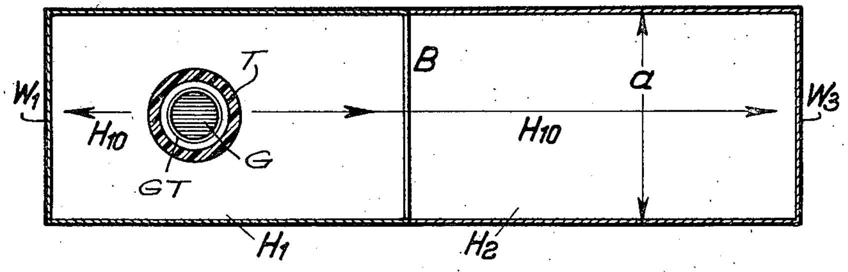

Although the physical dimensions of the second wave guide $H_2$ in Fig. 3 will have been reduced with respect to those of guide $H_2$ in Figs. 2*a*, 2*b* in accordance with the reduction in operating wavelength, they will be proportionately larger than those of the capacitively loaded and, hence, electrically lengthened guide $H_1$. Thus at the junction R between the two guides, which may or may not be provided with a diaphragm B, there will exist a discontinuity as the geometrical width of the structure changes from a smaller value $a_1$ in guide $H_1$ to a larger value $a_2$ in guide $H_2$; this discontinuity results in only a very loose coupling between the two resonators which, if $a_2$ is considerably greater than $a_1$, will be insufficient even if the diaphragm portion B of wall $W_2$ is completely removed. Since the loading of guide $H_1$ by the tube T is non-uniform, the electrical width of this guide at junction R may be less than one-half the operating free-space wave length and the dominant $H_{10}$ wave from guide $H_2$ will be able to penetrate only over a small distance into guide $H_1$ where it will be subject to severe attenuation.

Figure 4A:
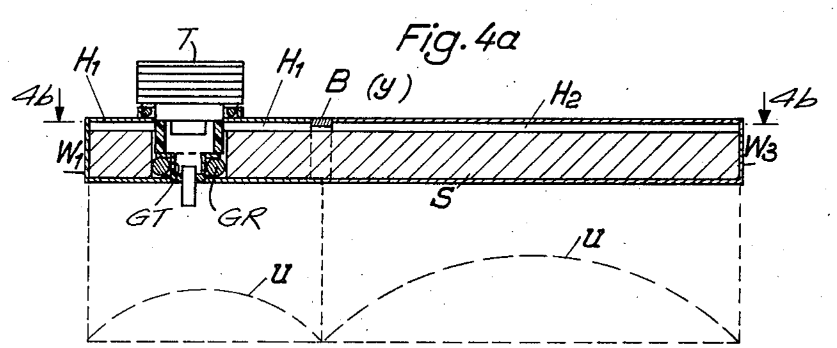
Figure 4B:
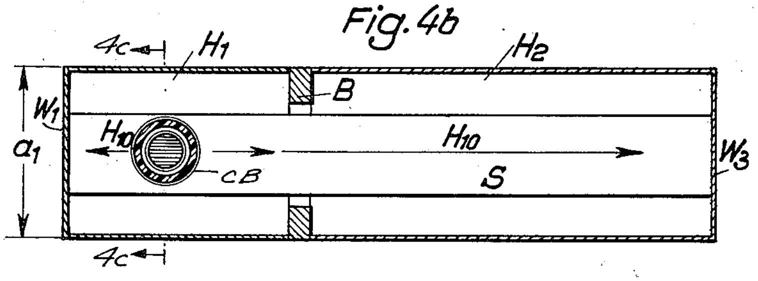
Figure 4C:
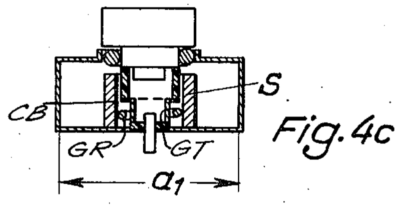

In accordance with the invention, and as shown in subsequent figures of the drawing, the capacitive loading is made uniform throughout the structure, or at least to the right of the wave source T as viewed in these figures, by the provision of a conductive bar S extending longitudinally within the interconnected wave guides. This bar, as shown in Figs. 4*a*–4*c*, rests on the lower flanges of the guides $H_1$, $H_2$ and is conductively connected, by way of ring GR, to the annular grid terminal GT of triode T which is inserted in a cylindrical bore CB of the bar S. Inasmuch as the electrical width of the structure will now be substantially constant throughout both guides (except possibly at their junction where the width of the aperture *y* of diaphragm B may be varied at will), the $H_{10}$ wave may travel therein as freely as in the system of Figs. 2*a* and 2*b*. Tuning of the overall structure may again be carried out, within wide limits, at the second voltage node by a displacement of wall $W_3$.

Figure 5A:
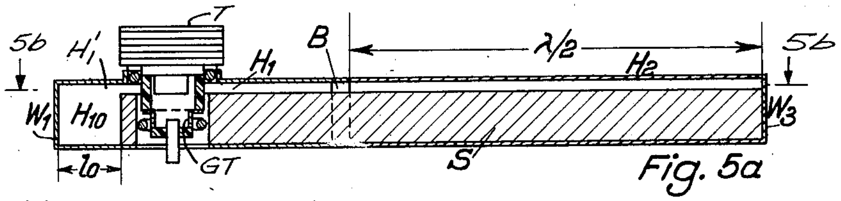
Figure 5B:
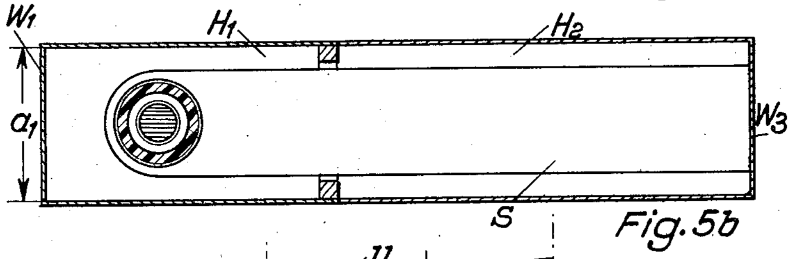

Figs. 5*a* and 5*b* show the foreshortening of the left-hand end of bar S, i. e. the omission of a portion of this bar extending from the source T in a direction opposite the desired direction of wave propagation. For a sufficient tight coupling between the annular grid terminal GT and the bar S it is, however, desirable that the tube T be completely surrounded by the bar, as illustrated. At $H_1'$, there is shown a wave guide portion, of length $l_0$, from which the bar S has been removed and whose electrical width therefore approaches its geometrical width $a_1$ with increasing distance from the tube T; thus the dominant wave of mode $H_{10}$ cannot spread through the guide portion $H_1'$, and its length $l_0$ is wholly immaterial.

Figure 6:
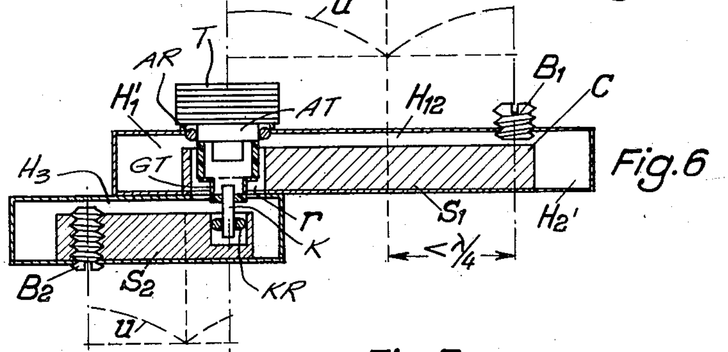
Fig. 6 is a view similar to Fig. 5*a* but showing the invention applied to a self-exciting oscillator.

Fig. 6 shows the previously outlined principles applied to a self-excited oscillation generator. A compound wave-guide structure, indicated at $H_{12}$, is coupled as before to the grid-plate or output circuit of tube T while a further wave guide, designated $H_3$, is coupled to the grid-cathode or input circuit thereof. Feedback between the two circuits is facilitated by the omission of coupling ring GR between grid terminal GT and conductive bar $S_1$, the latter resting on the lower flange of guide $H_{12}$ which in turn is in contact with the upper flange of guide $H_3$. This bar is foreshortened at both ends, thereby forming high-attenuation spaces $H_1'$ and $H_2'$, and is capacitively coupled with the grid terminal GT across an annular gap *r*. A second loading bar $S_2$ rests on the lower flange of guide $H_3$ and is conductively connected to an extension of cathode K through a coupling ring KR. Tuning studs $B_1$ and $B_2$ are inserted in each of the wave guides $H_{12}$ and $H_3$ near the ends of the bars $S_1$ and $S_2$, respectively, at a location not more than a quarter wavelength distant from the first voltage node. The electric field within the attenuation spaces $H_2'$ decays rapidly beyond the end of bar $S_1$.

Figures 7, 8:
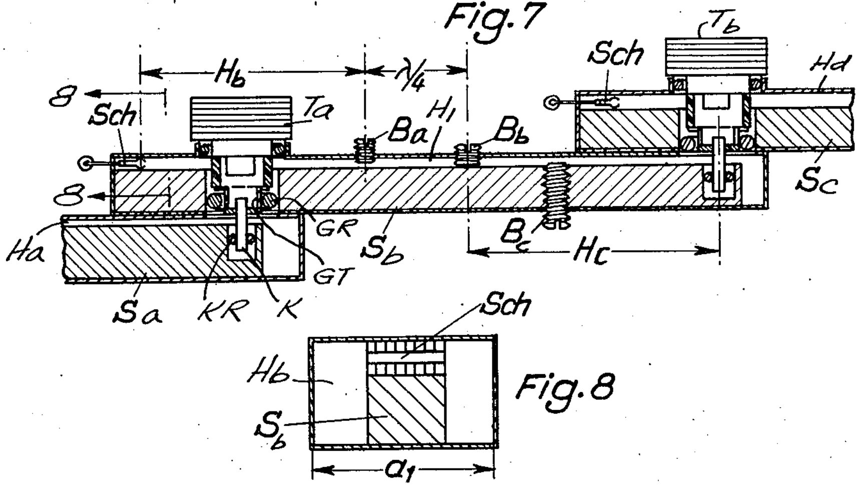
Fig. 7 is a view similar to Fig. 6 but showing the invention applied to a multi-stage amplifier.
Fig. 8 is a section taken on the line 8—8 of Fig. 7.

Figs. 7 and 8 show a multi-stage amplifier comprising a pair of triodes $T_a$ and $T_b$ as well as four wave guides $H_a$, $H_b$, $H_c$ and $H_d$. The coupling between the guides $H_a$, $H_b$ and the input and output electrodes of tube $T_a$ is similar to the coupling between guides $H_3$, $H_{12}$ and corresponding electrodes of tube T in Fig. 6, except that a conductive connection is formed, via a coupling ring GR, between the contacting flanges of the two guides on the one hand and the grid terminal GT on the other. The wave guides $H_b$ and $H_c$ are physically united to a single guide structure, with studs $B_a$ and $B_b$ marking the electrical end of guide $H_b$ and the electrical beginning of guide $H_c$, respectively. The connection between guides $H_c$, $H_d$ and tube $T_b$ is identical with that between guides $H_a$, $H_b$ and tube $T_a$.

The capacitive loading bars for the guide structures $H_a$, $H_b$—$H_c$ and $H_d$ are designated $S_a$, $S_b$ and $S_c$, respectively. The coupling between guide portions $H_b$ and $H_c$ is provided by an intermediate quarter-wavelength guide portion $H_l$ extending between the studs $B_a$ and $B_b$. This intermediate portion, however, may also be replaced by a length of concentric line, in which case the studs $B_a$ and $B_b$ would be replaced by coupling loops or other suitable input and output connections tying the guides $H_b$ and $H_c$ to this line.

The input circuit of tube $T_b$ is shown tunable by a stud $B_c$ inserted in the guide $H_c$. The output circuits $H_b$ and $H_d$ of tubes $T_a$ and $T_b$, respectively, are shown tunable with the aid of pistons *Sch* whose width may be equal to or less than the width $a_1$ of the respective guide; thus, as shown in Fig. 8, the piston *Sch* may be coextensive in width with the associated loading bar, such as bar $S_b$, its effect upon the guide being then limited to the provision of an adjustable short circuit between the bar and the upper flange of the guide.

It will be understood that suitable input and output couplings or probes, not shown, may be inserted in the various wave guides illustrated, that sources of oscillations to be amplified and/or modulated may be connected between the cathode and the grid of tube T in, say, Fig. 5*a* and that, in general, the embodiments disclosed may be modified in numerous ways without departing from the spirit and scope of the invention as defined in the appended claims.

What is claimed is:

1. In a wave transmission system, in combination, an amplifier for microwaves having parallel planar electrodes spaced along the axis of said amplifier and having input and output circuits, at least one of said circuits including a conductive wave guide of rectangular cross-section, the longer transverse dimension of said wave guide being less than one-half the free-space wavelength of said microwaves and being arranged substantially perpendicular to the axis of said amplifier, and capacitive loading means extending from said amplifier throughout at least a major portion of said guide in a manner increasing the electrical length of said longer transverse dimension to more than one-half said free-space wavelength, thereby enabling said microwaves to pass substantially unattenuated through said portion with a transverse-electric mode of propagation.

2. In a wave transmission system, in combination, a conductive wave guide, an electron tube having parallel planar electrodes and being inserted in said wave guide, said tube being provided with a substantially cylindrical electrode terminal having its axis transverse to the axis of said wave guide, and an elongated conductive bar extending axially through at least a major portion of said wave guide and forming a capacitive load therefor, said bar being provided near one end thereof with a transverse bore receiving said terminal and affording low-impedance coupling between said bar and said terminal at least at high frequencies.

3. In a wave transmission system, in combination, a conductive wave guide, an electron tube having parallel planar electrodes and being inserted in said wave guide, said tube being provided with a substantially cylindrical electrode terminal having its axis transverse to the axis of said wave guide, and an elongated conductive bar surrounding said terminal for low-impedance coupling therebetween at least at high frequencies, said bar extending on both sides of said terminal in longitudinal direction of said wave guide and forming a capacitive load therefor.

4. In a wave transmission system, in combination, an electron tube comprising a lighthouse triode having a cathode terminal, a grid terminal and a plate terminal, a first conductive wave guide provided with a longitudinally extending capacitive loading bar, said lighthouse triode being mounted in said first conductive wave guide with the axis of said triode being substantially perpendicular to the direction of wave transmission, said first wave guide having its envelope coupled to said plate terminal and having its said loading bar coupled to said grid terminal, and a second conductive wave guide provided with a longitudinally extending capacitive loading bar, said second wave guide having its envelope coupled to said grid terminal and having its said loading bar coupled to said cathode terminal.

5. In a wave transmission system, in combination, an electron tube of the lighthouse triode type, said tube comprising parallel planar electrodes defining an energy transfer gap, a conductive wave guide, and coupling means providing a low-impedance connection betwen said electrodes and said wave guide, said coupling means including a substantially cylindrical terminal for one of said electrodes, said terminal being inserted in said wave guide with its axis at right angles to the axis of said wave guide and the direction of said wave transmission, and an elongated conductive bar extending axially through at least a major portion of said wave guide and provided with a transverse recess receiving said terminal.

6. An oscillator for microwaves, comprising a vacuum tube provided with a cathode terminal, a grid terminal and a plate terminal, a first conductive wave guide provided with a longitudinally extending first capacitive loading bar, said first wave guide having its envelope coupled to said plate terminals, a second conductive wave guide in contact with said first wave guide adjacent said first loading bar, said first loading bar and adjacent envelope portions of said wave guides being provided with a through going slot forming a passage between said wave guides, and a second capacitive loading bar extending longitudinally in said second wave guide in spaced relation to said slot, an envelope portion of said first wave guide remote from said first loading bar being coupled to said plate terminal, said first loading bar being coupled to said grid terminal, said second loading bar being coupled to said cathode terminal.

7. An oscillator for microwaves, comprising a lighthouse triode having a parallel planar cathode, grid and plate and being provided with a cathode terminal, a cylindrical grid terminal and a plate terminal, a first conductive wave guide and a second conductive wave guide having a common envelope portion, a first capacitive loading bar extending longitudinally within said first wave guide along said common envelope portion, said first loading bar and said common envelope portion being provided with a transverse aperture forming an annular gap around said grid terminal and providing a passage between said wave guides while affording capacitive coupling between said first loading bar and said grid terminal, an envelope portion of said first wave guide opposite said common envelope portion being coupled to said plate terminal, and a second loading bar extending longitudinally within said second wave guide along an envelope portion thereof opposite said common envelope portion, said second loading bar being coupled to said cathode terminal.

8. In a wave transmission system, in combination, a conductive wave guide, an electron tube having parallel planar electrodes spaced along the axis of the tube, said tube being inserted in said wave guide with the axis of said tube substantially perpendicular to the direction of wave transmission, an elongated conductive bar extending axially through at least a major portion of said wave guide and forming a capacitive load therefor, one electrode of said tube being coupled to said bar and a second electrode being coupled to an envelope portion of said wave guide opposite said bar, and tuning means within said wave guide comprising a piston positioned adjacent said bar and displaceable in longitudinal direction thereof.

9. In a wave transmission system, in combination, a conductive wave guide, an elongated conductive bar extending axially through at least a major portion of said wave guide and forming a capacitive load therefor, thereby adapting said wave guide for transmission of high-frequency transverse-electric waves having a free-space wavelength in excess of double the geometrical width of said wave guide, a lighthouse triode having parallel planar electrodes spaced along the axis thereof and mounted in said guide portion for producing oscillations operating at said free-space wavelength, said guide being long enough to enable the development of a plurality of voltage nodes of said oscillations along its axis, and tuning means positioned at the second voltage node from said source.

10. In a wave transmission system, in combination, a conductive wave guide, an elongated conductive bar extending axially through at least a major portion of said wave guide and forming a capacitive load therefor, thereby adapting said wave guide for transmission of high-frequency transverse-electric wave having a free-space wavelength in excess of double the geometrical width of said wave guide, a lighthouse triode having parallel planar electrodes spaced along the axis thereof and mounted in said guide portion for producing oscillations operating at said free-space wavelength, said guide being long enough to enable the development of at least one voltage node of said oscillations along its axis, said bar extending beyond the first voltage node from said source but terminating short of the end of said wave guide, and capacitive tuning means cooperating with said bar at a location beyond said first voltage node but spaced from it by not more than a quarter wavelength.

11. In a wave transmission system, in combination, a conductive wave guide, a source of transverse-electric waves in said wave guide operating at a wavelength greater than the normal cutoff wavelength of said wave guide, and an elongated conductive bar coupled to said source and forming a sufficient capacitive load for a portion of said wave guide to increase its cutoff wavelength to a value greater than the operating wavelength of said source, said wave guide extending beyond said bar, thereby forming a space of high attenuation for said waves.

12. A multi-stage amplifier for microwaves, comprising a plurality of lighthouse triode amplifier tubes each having an input circuit and an output circuit and parallel planar electrodes spaced along the axis of their respective tube, a wave guide having a first portion in the output circuit of one of said tubes and a second portion in the input circuit of another of said tubes and arranged substantially perpendicular to the axes of said amplifier tubes, and an elongated conductive bar within said wave guide coupled at each end to an electrode of a respective one of said tubes, said bar constituting a substantially uniform capacitive load for said wave guide.

13. A multi-stage amplifier for microwaves, comprising a first amplifier tube having a plurality of parallel planar electrodes spaced along the axis thereof and having an output circuit, a first wave guide in said output circuit arranged substantially perpendicular to said first amplifier tube, a first elongated conductive bar in said first wave guide forming a capacitive load therefor and coupled to an electrode of said first tube, a second amplifier tube having a plurality of parallel planar electrodes spaced along the axis thereof and having an input circuit, a second wave guide in said input circuit arranged substantially perpendicular to said second amplifier tube, a second elongated conductive bar in said second wave guide forming a capacitive load therefor and coupled to an electrode of said second tube, and a concentric line interconnecting said wave guides.

14. A multi-stage amplifier for microwaves, comprising a first amplifier tube having a plurality of parallel planar electrodes spaced along the axis thereof and having an output circuit, a first wave guide in said output circuit arranged substantially perpendicular to said first amplifier tube, a first elongated conductive bar in said first wave guide forming a capacitive load therefor and coupled to an electrode of said first tube, a second amplifier tube having a plurality of parallel planar electrodes spaced along the axis thereof and having an input circuit, a second wave guide in said input circuit arranged substantially perpendicular to said second amplifier tube, a second elongated conductive bar in said second wave guide forming a capacitive load therefor and coupled to an electrode of said second tube, and coupling means interconnecting portions of said two guides remote from said electrodes, said coupling means including tuning means adapted to vary the coupling factor between said guides.

15. A multistage amplifier for microwaves, comprising a first amplifier tube having a plurality of parallel planar electrodes spaced along the axis thereof and having an output circuit, a first wave guide in said output circuit arranged substantially perpendicular to said first amplifier tube, a first elongated conductive bar in said first wave guide forming a capacitive load therefor and coupled to an electrode of said first tube, a second amplifier tube having a plurality of parallel planar electrodes spaced along the axis thereof and having an input circuit, a second wave guide in said input circuit arranged substantially perpendicular to said second amplifier tube, a second elongated conductive bar in said second wave guide forming a capacitive load therefor and coupled to an electrode of said second tube, and coupling means of quarterwave electric length interconnecting portions of said two guides remote from said electrodes.

References Cited in the file of this patent

UNITED STATES PATENTS

| | | |
|---|---|---|
| 2,409,913 | Tonks | Oct. 22, 1946 |
| 2,512,980 | Sunstein | June 27, 1950 |
| 2,556,881 | McArthur | June 12, 1951 |
| 2,660,667 | Bowen | Nov. 24, 1953 |

FOREIGN PATENTS

| | | |
|---|---|---|
| 241,120 | Switzerland | Feb. 15, 1946 |

OTHER REFERENCES

Ragan: Microwave Transmission Circuits, vol. 9, M. I. T. Radiation Lab. Series, McGraw-Hill Co., 1948, page 360 relied on.

Ragan: Microwave Transmission Circuits, vol. 9, Rad. Lab. Series, published 1948, McGraw-Hill Co., pp. 358–359 relied on.